(12) United States Patent
Karinca (10) Patent No.: US 11,515,780 B2
(45) Date of Patent: Nov. 29, 2022

(54) MACHINES HAVING POWER-ELECTRONIC ENERGY CONVERTERS AND LEAKAGE CURRENT COMPENSATION AND SYSTEM

(71) Applicant: TDK Electronics AG, Munich (DE)

(72) Inventor: Yasin Karinca, Giengen (DE)

(73) Assignee: TDK ELECTRONICS AG, Munich (DE)

( * ) Notice: Subject to any disclaimer, the term of this patent is extended or adjusted under 35 U.S.C. 154(b) by 168 days.

(21) Appl. No.: 16/965,862

(22) PCT Filed: Jan. 21, 2019

(86) PCT No.: PCT/EP2019/051383
§ 371 (c)(1),
(2) Date: Jul. 29, 2020

(87) PCT Pub. No.: WO2019/149559
PCT Pub. Date: Aug. 8, 2019

(65) Prior Publication Data
US 2021/0057983 A1    Feb. 25, 2021

(30) Foreign Application Priority Data
Jan. 31, 2018   (DE) .......................... 102018102122.4

(51) Int. Cl.
*H02M 1/12* (2006.01)
*H03H 1/00* (2006.01)
*G01R 31/00* (2006.01)
*H02M 1/44* (2007.01)
*H03H 7/42* (2006.01)

(52) U.S. Cl.
CPC ............ *H02M 1/12* (2013.01); *G01R 31/001* (2013.01); *H02M 1/44* (2013.01); *H03H 7/427* (2013.01); *H03H 1/0007* (2013.01)

(58) Field of Classification Search
CPC ........ H03H 1/0007; H03H 7/427; H01M 1/12
USPC .................................................. 333/177, 181
See application file for complete search history.

(56) References Cited

U.S. PATENT DOCUMENTS

| 5,831,842 A | 11/1998 | Ogasawara et al. |
| 2005/0280405 A1 | 12/2005 | Bray |
| 2017/0179931 A1 | 6/2017 | Tucker |

FOREIGN PATENT DOCUMENTS

| DE | 2854196 A1 | 6/1980 |
| DE | 154465 A3 | 3/1982 |
| DE | 102008024348 A1 | 12/2009 |
| DE | 102011078304 A1 | 1/2013 |
| EP | 2963752 A2 | 1/2016 |
| EP | 3113361 A1 | 1/2017 |

(Continued)

OTHER PUBLICATIONS

HP,"Leakage current compensation LEAKCOMP® HP", Total 10 Pages.

(Continued)

*Primary Examiner* — Rakesh B Patel
(74) *Attorney, Agent, or Firm* — Slater Matsil, LLP (57) ABSTRACT

A device includes an EMC (electromagnetic compatibility) filter, a frequency converter coupled to the EMC filter, and a motor coupled to the frequency converter via a motor cable. A leakage current compensator includes a leakage current detector and a compensation current generator configured to generate a compensation current that is directed against the leakage current and is overlaid on the leakage current in such a way that the leakage current is reduced.

18 Claims, 5 Drawing Sheets

(56) References Cited

FOREIGN PATENT DOCUMENTS

| EP | 3208905 A2 | 8/2017 |
|---|---|---|
| EP | 3255770 A1 | 12/2017 |
| JP | 2010057268 A | 3/2010 |
| WO | 2014048471 A1 | 4/2014 |

OTHER PUBLICATIONS

D. Y. Lee et al., "Design of an Input Filter for Power Factor Correction (PFC) AC to DC Converters Employing an Active Ripple Cancellation", IEEE, 1996, pp. 582-586.

Marcelo L. Heldwein et al., "Implementation of a Transformerless Common-Mode Active Filter for Offline Converter Systems", IEEE Transactions On Industrial Electronics, vol. 57, No. 5, May 2010, pp. 1772-1786.

Satoshi Ogasawara et al.,"An Active Circuit for Cancellation of Common-Mode Voltage Generated by a PWM Inverter", IEEE , pp. 1547-1553.

Wenjie Chen et al., "A Novel Hybrid Common-Mode EMI Filter with Active Impedance Multiplication", IEEE Transactions on Industrial Electronics, vol. 58. No. 5, May 2011, pp. 1826-1834.

MACHINES HAVING POWER-ELECTRONIC ENERGY CONVERTERS AND LEAKAGE CURRENT COMPENSATION AND SYSTEM

This patent application is a national phase filing under section 371 of PCT/EP2019/051383, filed Jan. 21, 2019, which claims the priority of German patent application 102018102122.4, filed Jan. 31, 2018, each of which is incorporated herein by reference in its entirety.

TECHNICAL FIELD

The invention relates to machines having power-electronic energy converters and leakage current compensation and system.

BACKGROUND

Machines and systems frequently use switch-mode power supplies and electronic drives. In order to satisfy the statutory requirements for electromagnetic compatibility (EMC), filter measures against electric interference are necessary. Leakage currents that can trigger fault current circuit breakers (RCD) arise from these EMC filters—in particular if these are used for personal protection. Operation at sockets with a fault current circuit breaker for personal protection is thus not possible. With a fault current circuit breaker having a higher trigger threshold, however, the machine and building are only protected against fire. The machines and systems are therefore often either connected permanently to the grid, fitted with an isolating transformer, or operated at special sockets without protection switches. A further possibility is that of guiding the leakage currents—where possible—to the neutral line. The personal protection is provided by way of the protective earth (PE).

The measures referred to above, however, have significant disadvantages.

Compact, mobile machines that can be employed flexibly are needed. This entails, for example, that the machines can easily be brought out of the production rooms to a different location for cleaning. This is not possible with machines having a fixed connection.

Machines with an inbuilt isolating transformer become larger and heavier, which also hinders the movability—exactly as do isolating transformers that are mounted in external housings and which can be connected upstream of the machine. As a result of the isolating transformers, the leakage currents, and therefore also the insulating fault current, remain on the secondary side of the transformer. The recognition of whether a compensating current is flowing can, however, only be measured and recognized by the fault current circuit breaker on the primary side of the transformer. This means that no protection is afforded by the fault current circuit breaker. This protection is, however, urgently wanted, in particular in wet rooms. The attachment and identification of special sockets that are not secured by fault current circuit breakers also increase the expense and reduces the flexibility as well as the safety.

Special filters and converters are necessary if the filter currents are diverted via the neutral line. The leakage currents of the cable screens continue to flow as before via the protective earth as the screens can be connected to the neutral line. Not all types of grid have a separate neutral line, and this solution can therefore not be replaced globally. With more extensive EMC filtering (larger, over-dimensioned filters) the high frequency leakage currents can, furthermore, be reduced. More effective EMC input filters in combination with additional output filters can, perhaps, be employed, although this is associated with higher costs. The problem of space is a further disadvantage of this measure against leakage currents, and occurs above all when retrofitting with larger and additional filters.

The use of fault current circuit breakers with a higher trigger threshold is also conceivable, although associated with considerable risks, since potential shifts occur as a result of the higher leakage currents, and the permitted contact voltage of at most 50 VAC can be exceeded. Damage to the individual components of the system is moreover possible.

SUMMARY OF THE INVENTION

Starting from this basis, the present invention addresses the task of providing improved machines that can be employed flexibly and, at the same time, can be operated safely.

The device is a machine with a load circuit that generates a leakage current. The device comprises a motor in order, for example, to drive a conveyor. In order to satisfy the statutory requirements for electromagnetic compatibility, filter measures against electric interference are necessary. The device here also in particular comprises a frequency converter. Through this at least one filter and a cable to the motor, leakage currents can arise that can trigger a fault current circuit breaker. A leakage current compensator is provided for this reason according to the present invention with an apparatus for detecting a leakage current (i.e., a leakage current detector) as well as with compensation current generator (i.e., an apparatus for generating a compensation current) that generates a current directed against the leakage current and is overlaid on the leakage current in such a way that the leakage current is reduced, in particular is essentially eliminated. The leakage current is here reduced at least to the extent that it is below the threshold for triggering an RCD protection switch. The leakage current is preferably completely eliminated.

This entails the advantage that the currents balance one another out and the fault current circuit breaker no longer triggers as a result of increased leakage currents. Only insulation faults or dangerous body currents can be recognized and lead to triggering. A frequency range of, for example, 100 Hz up to 300 kHz should be covered here. The frequency range from 50-60 Hz must not be compensated for so that the personal protection remains effective. The invention brings the advantage that full personal protection is provided, and the device can nevertheless be moved, since it does not have to be permanently installed and a large, heavy transformer does not have to be integrated. Inter alia this also brings better hygiene due to simplified cleaning of the machine, and greater flexibility in terms of the combination of individual machines. The leakage current compensator is economical, and can be retrofitted to existing machines in a simple manner. High energy efficiency results in comparison with isolating transformers. A wide range of voltages can be covered according to the present invention, in such a way that the device can be employed globally. Insulation faults or device short are 100% recognized with upstream fault current circuit breakers.

The compensation current can be shifted in its phase with respect to the leakage current by 180° and has essentially the same amplitude. Leakage current can thus be completely compensated for. Since it is sufficient for the leakage current to be below the threshold for triggering the RCD protection switch, the leakage current can amount to, for example, about 40% of the trigger threshold of the RCD protection switch. The important point here is that the leakage current is, for example, smaller than the trigger threshold. The compensation current generator advantageously comprises an amplifier as well as a capacitor network (as filter capacitors), via which the compensation current can be fed to individual phases of a multiphase system, in particular at least one of the three phases, preferably all three phases of a three-phase system. The current can here, for example, be detected in all three phases and, through forming the difference, the leakage current of each phase can be determined and, with respect to a symmetrical load distribution, a respective compensation current is guided onto the corresponding phases.

The compensation current generated by the amplifier is advantageously distributed over the three phases in such a way that in total the leakage current is compensated for or adequately reduced.

The leakage current compensator is preferably located between a fault current circuit breaker (RCD) and the EMC filter, i.e., the EMC input filter. The leakage currents generated by the filter can thus be compensated for, also however further leakage currents generated in the load circuit through parasitic coupling, in particular as a result of long motor lines and/or a frequency converter.

According to one preferred exemplary embodiment, the leakage current compensator is installed in a unit upstream of the device. The device in particular comprises a plug that can be connected to the leakage current compensator through a socket, in particular an industrial socket. The device then thus comprises this unit which in turn can be connected to the grid with a plug, in particular industrial plug, via a socket, in particular an industrial socket. This entails the advantage that the devices can be plugged in flexibly at different locations and that a corresponding unit can easily be retrofitted. A corresponding upstream unit can then also be used for different devices. It is, however, also possible that the device is connected permanently to the upstream unit via a cable, and then can then be connected via a plug to a socket, in particular an industrial socket. The voltage supply of the leakage current compensator, in particular the amplifier, can take place by way of the voltage supply of the device, i.e., by way of the grid voltage. If, for example, the leakage current compensator is installed in the upstream unit, the problem arises that the fault current circuit breaker is triggered when this unit is inserted into the industrial socket. This results from the fact that the phases are not contacted exactly simultaneously when inserting, and that asymmetric load currents then occur through the Y-capacitors which cause the upstream RCD to trigger. In order to prevent this the device comprises a delay apparatus that is designed such that the compensation current is overlaid with a time delay, i.e., in particular only when all the phases of the plug are contacted as the device is plugged into the grid. This means that the capacitor network is preferably only connected when all phases of the plug are contacted as the device is plugged in. The delay circuit can here be designed, for example, as a switching relay, semiconductor relay, time delay relay or as a software solution or, however, realized in the form of a mechanical solution, in that the power supply for the compensation apparatus takes place via plug contacts in a plug that are located further back when plugging together than the contacts for the power supply of the device, so that the contacts of the compensation apparatus only have contact after the power contacts already have contact.

It is also possible that the leakage current compensator is integrated into the device and is supplied via a separate auxiliary voltage supply, so that when switching on the device the leakage current compensator is already supplied with current before a leakage current is generated in the load circuit. It is advantageous and space-saving if the leakage current compensator is integrated into the machine. This means that there is no additional requirement for space outside the machine if the leakage current compensator is integrated into the machine, it would be possible that the fault current circuit breaker (RCD) triggers in an unwanted manner if, after switching the device on, leakage currents already occur but the compensator is not yet ready for operation. To prevent this, the leakage current compensator is supplied with the separate auxiliary voltage which is present before the load circuit generates the leakage current. The system can thus compensate for the current before the fault current circuit breaker triggers. With this solution it is also no longer harmful if the phases of the load circuit are connected in a non-symmetrical manner. An expensive protection with simultaneously closing contacts is thus not necessary.

As already described, the present invention allows the device to be unplugged and therefore movable. If the device comprises the external unit with the leakage current compensator, this unit comprises a grid plug.

With the method according to the invention, in particular with a device according to at least one of the claims relating to a corresponding device, a leakage current that is generated by the load circuit is detected during operation of the device and a compensation current that is directed against the leakage current is generated by a leakage current compensator. The compensation current is overlaid onto the leakage current, whereby the leakage current is reduced, in particular is essentially eliminated.

The leakage current compensator comprises an amplifier and a capacitor network. When the device is plugged in, the compensation current is advantageously only connected in via the capacitor network with a time delay when, during plugging in, all the phases of a plug of the device are contacted, i.e., are connected to the grid.

It is also possible that the voltage supply of the leakage current compensator takes place via the voltage supply of the device or, however, that the leakage current compensator is integrated into the device and is supplied via a separate auxiliary voltage supply in such a way that the compensation current is already present before a leakage current is generated at the load circuit. The system can thus compensate for the current before the fault current circuit breaker triggers.

According to the present invention the device can thus now be unplugged, i.e., disconnected from the grid by means of a grid plug, moved to a different production location, and then plugged in again. This enables increased flexibility at the same time as safety.

The leakage current compensator is advantageously located between a fault current circuit breaker and an EMC filter. If the leakage current compensator is arranged prior to the EMC input filter, all the leakage current of the load circuit can be compensated for. It is particularly advantageous if the device is supplied with voltage via a three phase grid, and the current in the three phases is detected, and the leakage current is determined by forming the difference, corresponding signals are supplied to an amplifier that comprises an evaluation unit in order to generate a compensation current that is fed via a capacitor network into at least one, preferably all three phases, whereby the result is essentially an elimination of the leakage current.

DETAILED DESCRIPTION OF ILLUSTRATIVE EMBODIMENTS

Figure 1:
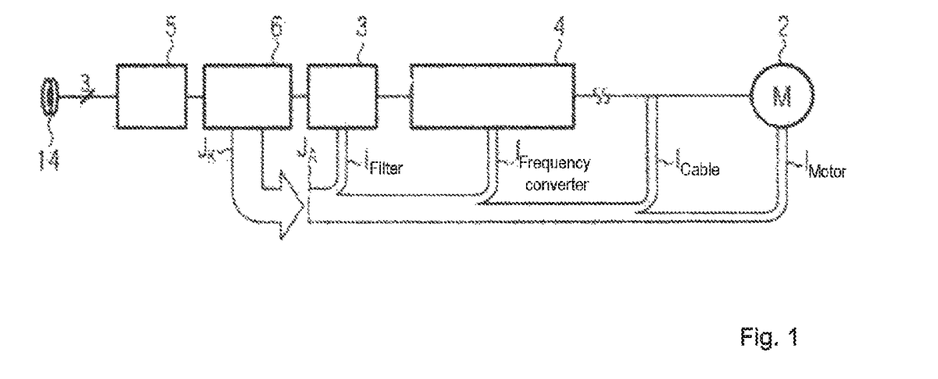
FIG. 1 shows in an approximate, schematic manner a device according to the invention with leakage current compensator.

FIG. 1 shows in an approximate, schematic manner a load circuit for the motor 2. FIG. 1 shows in an approximate, schematic manner a typical drive system, which comprises essentially an EMC input filter 3, a frequency converter 4, a motor cable 5 and a motor 2. The EMC filter, the frequency converter 4 and the long motor cable, as well as the motor 2 can all generate leakage currents that would trigger a fault current circuit breaker 5. According to the present invention, a leakage current compensator 6 which generates a compensation current $I_K$ that is directed against the leakage current $I_A$ is provided before the EMC filter 3. The leakage current can thus be compensated for, i.e., eliminated, or at least reduced to the extent that it lies below the threshold for triggering the RCD fault current circuit breaker 5, for example below the trigger threshold of 30 mA for currents in the frequency range <100 Hz, up to 300 mA for currents with a frequency >1000 Hz.

The leakage current $I_A$ here is the total of all the individual leakage currents, the total of $I_{Filter}+I_{Frequency\ converter}+I_{Cable}+I_{Motor}$. According to the present invention, a frequency range between 100 Hz and 300 kHz should be covered. The frequency range from 50 to 60 Hz must not be compensated for, so that the personal protection remains effective. Compensation currents of up to 1 A are necessary in practice. The compensation current $I_K$ is preferably shifted in its phase by 180° with respect to the leakage current $I_A$, and has essentially the same amplitude.

Figure 2:
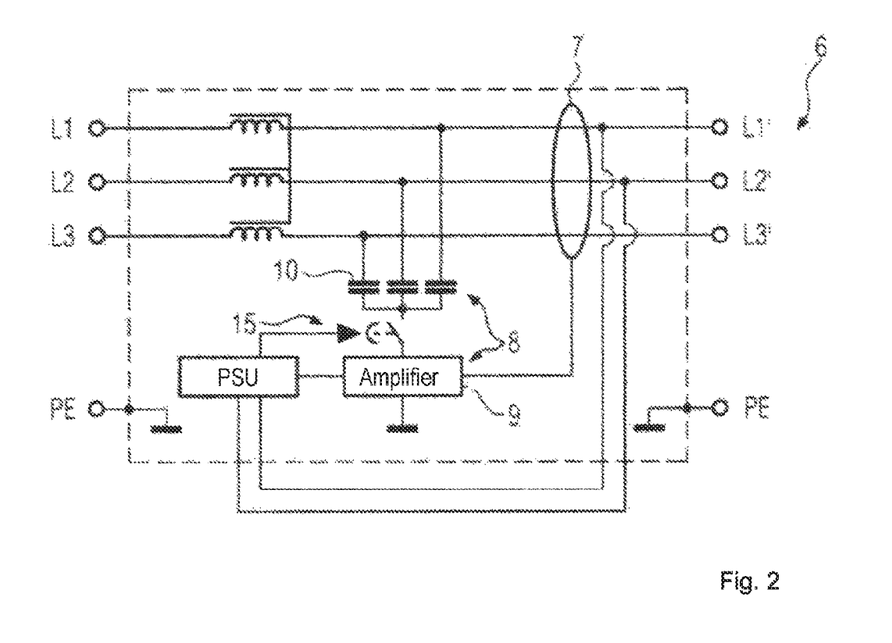
FIG. 2 shows in an approximate, schematic manner an equivalent circuit diagram of a leakage current compensator.
Figure 3:
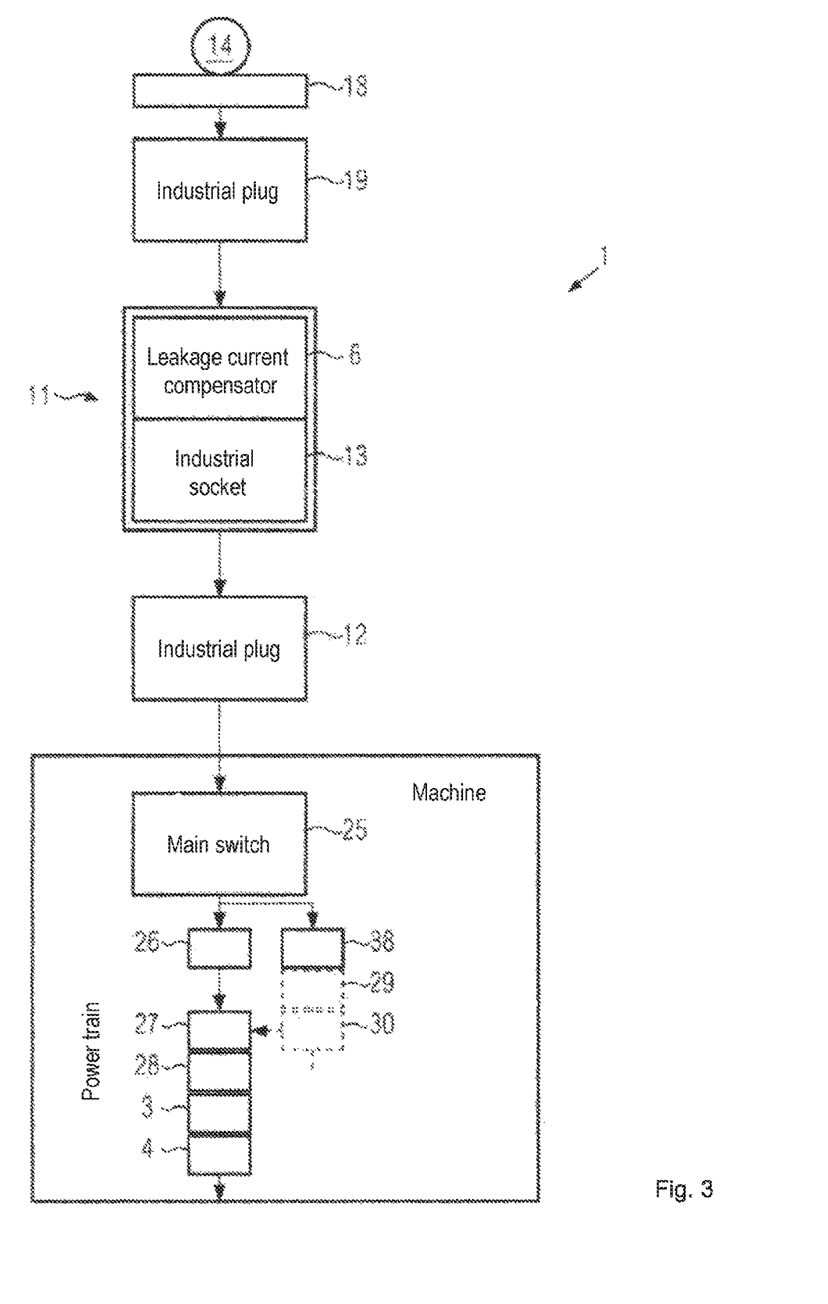
FIG. 3 shows in an approximate, schematic manner a form of embodiment of a device according to the invention with an external leakage current compensator.

FIG. 2 shows an equivalent circuit diagram of the leakage current compensator 6 for the exemplary embodiment shown in FIG. 3. FIG. 2 shows a three-phase grid. The leakage current compensator 6 comprises an apparatus for measuring a leakage current 7 as well as an compensation current generator 8. The compensation current generator 8 comprises an amplifier 9 that is connected to the apparatus for measuring the leakage current 7, and comprises an evaluation unit that can determine a leakage current $I_A$ and a compensation current $I_K$ on the basis of the measured values. The leakage current detector 7 can, for example, here comprise a current clamp. The current of the three phases can be detected, and the leakage current from the corresponding differences. This means that if the sum of the currents in the three phases $L_1$, $L_2$, $L_3$ is not 0, there is a leakage current U. The compensation current $I_K$ is, for example, calculated in such a way that it is shifted in its phase through 180° with respect to the leakage current $I_A$ and that it has essentially the same amplitude as the leakage current. FIG. 2 shows a simplified illustration that the amplifier 9 feeds the compensation current onto the three phases on the basis of the determined compensation current $I_K$ in such a way that the total of the currents of the individual phases $L_1$, $L_2$, $L_3$ again for example yields 0, and thus the leakage current is compensated for, or at least however lies below a trigger threshold of the RCD switch.

The respective current $I_{L1}$, $I_{L2}$, $I_{L3}$ can for example be measured.

By forming the difference here a leakage current and a compensation current directed against it, which is then distributed over the three phases $L_1$, $L_2$, $L_3$, can for example be determined.

It is also however possible to determine an individual leakage current for each phase by measuring the currents in each individual phase, and to then determine corresponding compensation currents for the individual phases and correspondingly supply them to each phase.

In this exemplary embodiment, the leakage current compensator, as already explained, is supplied via the voltage supply 14 with voltage by way here of two of the phases of the three-phase system.

The device further advantageously comprises a delay apparatus 15. The delay apparatus 15 is designed in such a way that the compensation current $I_K$ is overlaid with a time delay, in particular only when all phases of the plug 19 are contacted as the device is inserted. This means that the capacitor network 10 is only connected when all phases of the plug are contacted as the device is plugged in. In this way the possibility that the RCD can trigger immediately as the device 1 is inserted can be prevented. The basis of the problem is that the phases $L_1$, $L_2$, $L_3$ are not contacted exactly simultaneously when inserting, and that asymmetric load currents then occur through the Y-capacitors of the capacitor network 10 which can cause the upstream RCD 5 to trigger. This can be prevented through the delay circuit 15. The delay circuit 15 can be realized for example as a time delay relay, a semi-conductor relay, a time delay relay or, however, as a software solution. There is further the possibility of a mechanical delay apparatus 15 of such a type that the leakage current compensator 6 is supplied with voltage with a time delay in that, for example, the plug 19 is designed such that the contacts that supply the leakage current compensator 6 with voltage sit further back when being plugged together, so that they do not have contact until after the power contacts already have contact. This can be realized through, for example, shorter pins.

FIG. 3 shows a form of embodiment according to the present invention with an external leakage current compensator 6 which is arranged outside the machine housing. FIG. 3 shows a voltage supply 14, for example a three-phase grid, as well as an industrial socket 18 through which the one device can be plugged in with a grid plug 19. In this exemplary embodiment, the leakage current compensator 6 is installed in an upstream unit 11 which comprises a further industrial socket 13 into which an industrial plug 12 of the device 1 can in turn be inserted. The industrial plug 12 is connected via an appropriate line to the main switch 25 of the device. A motor protection switch 26 can then be provided, as well as a main contactor 27 without "symmetric contacts", i.e., without spring contacts. Following this a power choke component 28 can be provided, followed by an EMC filter 3 and a frequency converter from which the motor 2 can be supplied. After the main switch 25, a line can branch off to a transformer protection switch 38 that is connected to a control transformer 29 and supplies a controller 30. The controller 30 is connected to the main contactor in order to switch the main contactor on. As can be seen from FIG. 3, the leakage current compensator 6 is supplied with current in the same load circuit as the motor via the voltage supply 14, i.e., the grid voltage. The leakage current compensator is thus located before the main switch 25.

Figure 4:
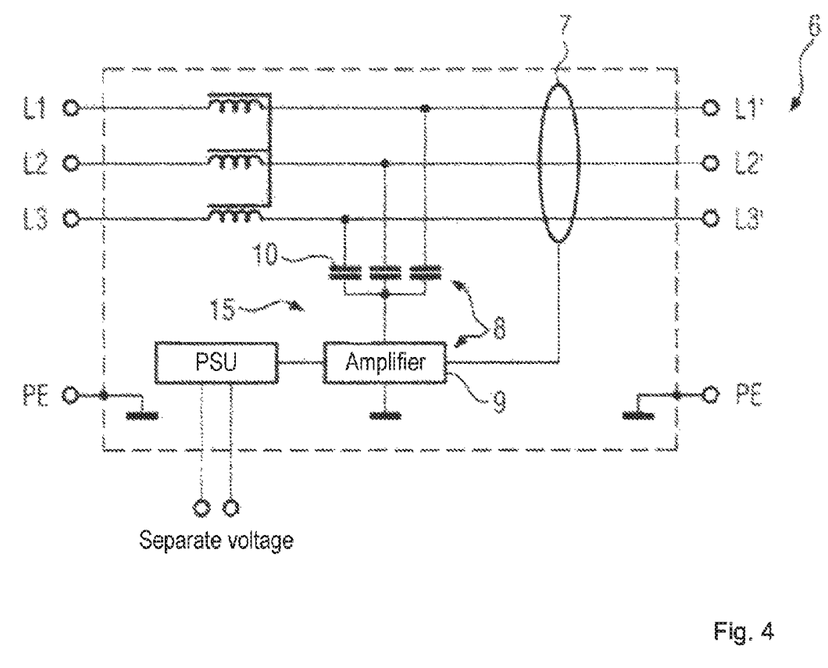
FIG. 4 shows in an approximate, schematic manner an equivalent circuit diagram of a leakage current compensated with external voltage supply.
Figure 5:
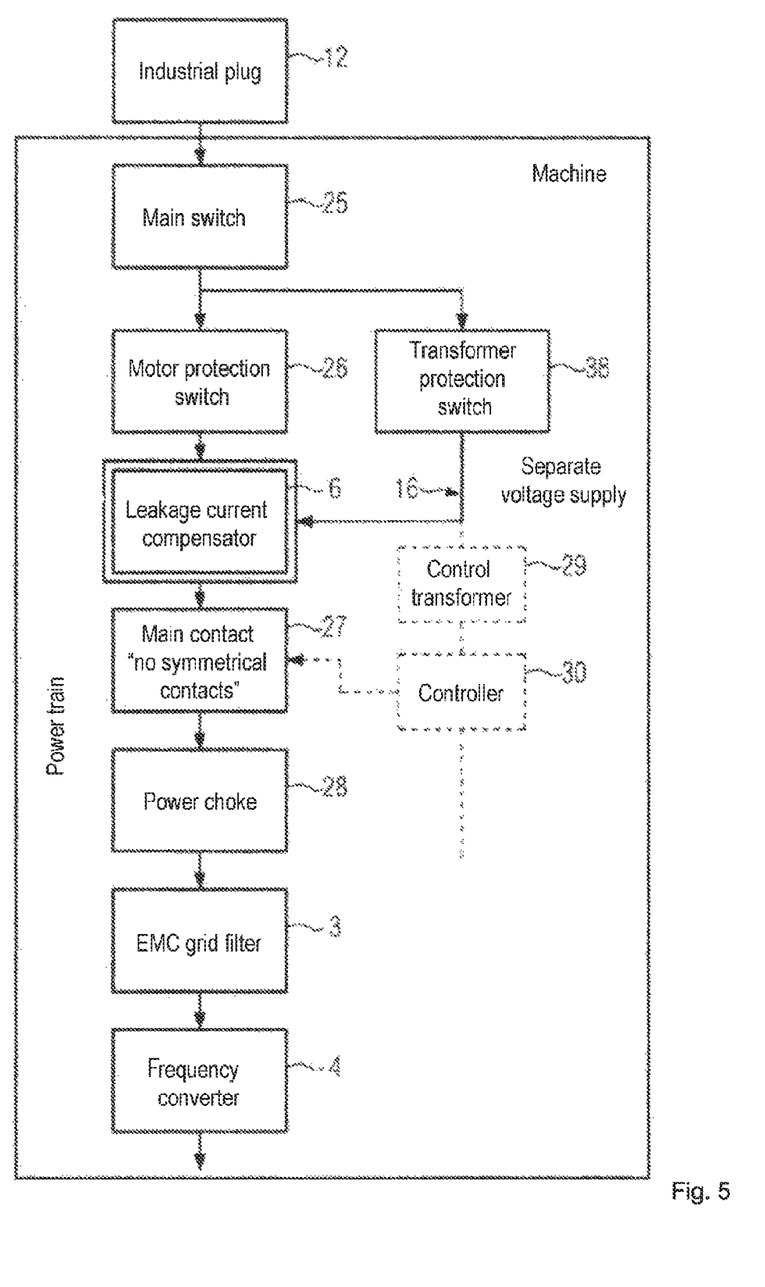
FIG. 5. shows in an approximate, schematic manner a further exemplary embodiment of the present invention with integrated leakage current compensator.

FIGS. 4 and 5 show a further form of embodiment according to the present invention. The leakage current compensator 6 is installed, i.e., integrated here directly into the device. As can be seen, the leakage current compensator 6 is located between the industrial plug 12 and the EMC grid filter 3. In order here again to prevent the RCD fault current circuit breaker from triggering in an undesired manner, the leakage current compensator 6 is supplied with a separate auxiliary voltage 16 and not, as in the first exemplary embodiment, via the grid voltage 14. Different separate auxiliary voltage supplies 16 can be used here. As in the exemplary embodiment shown in FIG. 5, current is for example branched off after the main switch to a transformer protection switch and supplied to the leakage current compensator 6. This avoids the problem that the RCD triggers in an unwanted manner if leakage currents occur after the machine has been switched on but the compensator is however not yet ready for operation. To prevent this, the compensator is supplied with a separate auxiliary voltage which is present before the load circuits that generate the leakage current are connected. The system can thus compensate for the leakage current $I_A$ before the RCD fault current circuit breaker triggers. With this solution it is also no longer harmful if the phases of the load circuits are connected in a non-symmetrical manner.

An expensive protection with simultaneously closing contacts is thus not necessary.

Figure 6:
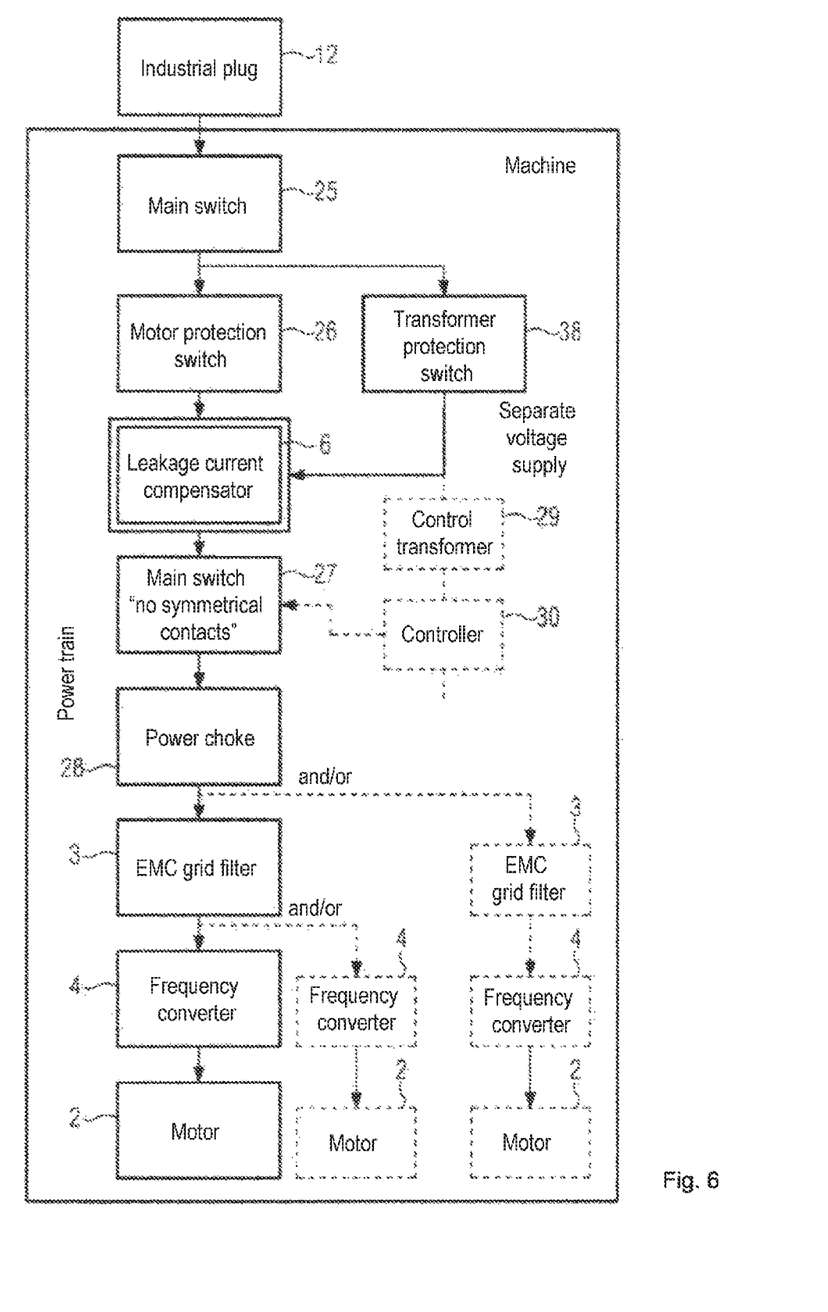
FIG. 6 shows a further exemplary embodiment according to the present invention.

FIG. 6 shows a further exemplary embodiment according to the present invention. The exemplary embodiment shown in FIG. 6 here corresponds to the exemplary embodiment shown in FIG. 5. A plurality of motors are present in the device in this exemplary embodiment.

This means that in addition to one motor a further motor or plurality of motors for another functional unit are provided in one machine or system. According to a first alternative here for example a further frequency converter can be provided after the EMC grid filter for the further motor 2 and/or a further EMC grid filter and a further frequency converter for a further motor provided after the power choke. These load circuits, i.e., a plurality of motors, can thus also be secured by means of only one leakage current compensator 6.

The invention claimed is:

1. A device comprising:
   an EMC (electromagnetic compatibility) filter;
   a frequency converter coupled to the EMC filter; and
   a motor coupled to the frequency converter via a motor cable; and
   a leakage current compensator comprising a leakage current detector and a compensation current generator configured to generate a compensation current that is directed against the leakage current and is overlaid on the leakage current in such a way that the leakage current is reduced after a time delay relative to when the compensation current is generated.

2. The device according to claim 1, wherein the compensation current generator is configured to generate the compensation current to have substantially the same amplitude as the leakage current and to shift a phase of the compensation current with respect to the leakage current by 180°.

3. The device according to claim 1, wherein the compensation current generator comprises an amplifier and a capacitor network, via which the compensation current can be fed to individual phases of a multiphase system.

4. The device according to claim 3, further comprising a delay element that is designed such that the compensation current is overlaid with the time delay so that all phases of the multiphase system are contacted with the device as the device is connected to the multiphase system.

5. The device according to claim 1, wherein the leakage current compensator is arranged between a fault current circuit breaker and the EMC filter.

6. The device according to claim 1, wherein the leakage current compensator is installed in a unit upstream of the device.

7. The device according to claim 6, further comprising a socket so that a plug of the unit upstream of the device can be connected to the leakage current compensator through the socket.

8. The device according to claim 6, further comprising a voltage supply coupled to supply a voltage to the frequency converter, wherein a voltage supply of the leakage current compensator takes place by way of the voltage supply of the device.

9. The device according to claim 1, further comprising a delay element that is designed such that the compensation current is overlaid with the time delay.

10. The device according to claim 1, wherein the leakage current compensator is integrated into the device and is supplied via a separate auxiliary voltage supply.

11. The device according to claim 1, wherein the device can be unplugged and is movable.

12. A method for operating a machine with a load circuit that generates a leakage current, the method comprising:
    detecting the leakage current; and
    generating a compensation current that is directed against the leakage current; and
    overlying the compensation current on the leakage current in such a way that the leakage current is substantially eliminated after a time delay relative to when the compensation current is generated.

13. The method according to claim 12, wherein the compensation current is generated using a device that includes an amplifier and a capacitor network and wherein the load circuit is a multi-phase circuit, the method further comprising:
    plugging the device into the machine with the load circuit that generates the leakage current; and
    delaying the compensation current from being overlaid on the leakage current until the device is plugged in and all the phases of the multi-phase circuit are contacted.

14. The method according to claim 13, wherein the amplifier is supplied with a voltage is supplied via a separate auxiliary voltage supply and other circuitry of the device is supplied with an internal voltage supply.

15. The method according to claim 13, further comprising:
    unplugging the device;
    moving the device to a different location; and
    plugging the device into a different machine.

16. The method according to claim 12, wherein the compensation current is generated using a device that is supplied with a voltage via a three-phase grid, the method comprising:

detecting a current in the three phases;

supplying corresponding signals to an amplifier to determine the respective leakage current through forming a difference; and generating the compensation current that is fed via a capacitor network into three phases.

17. A device comprising:

a leakage current detector; and a compensation current generator configured to generate a compensation current that is shifted in phase with respect to the leakage current by 180° and has essentially the same amplitude, wherein the compensation current generator comprises an amplifier and a capacitor network via which the compensation current can be fed to individual phases of a multiphase system, and wherein the leakage current detector and the compensation current generator are arranged between a fault current circuit breaker and an EMC filter.

18. The device according to claim 17, wherein the device further comprises:

the EMC filter;

a frequency converter;

a motor cable; and a motor.

* * * * *